(12) United States Patent
Grötsch et al.

(10) Patent No.: US 8,154,031 B2
(45) Date of Patent: Apr. 10, 2012

(54) MODULE COMPRISING RADIATION-EMITTING SEMICONDUCTOR BODIES

(75) Inventors: Stefan Grötsch, Lengfeld/Bad Abbach (DE); Berthold Hahn, Hemau (DE); Stefan Illek, Donaustauf (DE); Wolfgang Schnabel, Langquaid (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 426 days.

(21) Appl. No.: 11/885,204

(22) PCT Filed: Feb. 10, 2006

(86) PCT No.: PCT/DE2006/000232
§ 371 (c)(1),
(2), (4) Date: Aug. 18, 2008

(87) PCT Pub. No.: WO2006/089512
PCT Pub. Date: Aug. 31, 2006

(65) Prior Publication Data
US 2008/0303038 A1    Dec. 11, 2008

(30) Foreign Application Priority Data
Feb. 28, 2005   (DE) .................. 10 2005 009 060

(51) Int. Cl.
*H01L 33/00* (2010.01)
(52) U.S. Cl. ............... 257/88; 257/99; 257/E33.062; 257/E33.066
(58) Field of Classification Search ........... 257/E33.062, 257/E33.002–E33.143, E25.019–E25.02, 257/E25.028, 79–103, 623–626, 678–733, 734–786, 787–796; 313/500; 362/227–249
See application file for complete search history.

(56) References Cited

U.S. PATENT DOCUMENTS

| | | | | |
|---|---|---|---|---|
| 4,775,645 | A | * | 10/1988 | Kurata et al. .................... 438/28 |
| 4,845,405 | A | * | 7/1989 | Yamane et al. ............... 313/500 |
| 5,936,353 | A | | 8/1999 | Triner et al. |
| 6,459,100 | B1 | | 10/2002 | Doverspike et al. |
| 6,472,726 | B1 | | 10/2002 | Hashimoto |
| 2002/0176251 | A1 | * | 11/2002 | Plank et al. .................... 362/241 |
| 2003/0020087 | A1 | * | 1/2003 | Goto et al. ..................... 257/103 |
| 2003/0178627 | A1 | * | 9/2003 | Marchl et al. ................... 257/80 |
| 2004/0075399 | A1 | | 4/2004 | Hall |
| 2005/0253151 | A1 | * | 11/2005 | Sakai et al. ..................... 257/79 |

FOREIGN PATENT DOCUMENTS

| | | |
|---|---|---|
| CN | 1287687 | 3/2001 |
| DE | 23 15 709 | 10/1974 |
| EP | 0 303 741 | 8/1987 |
| EP | 0 315 905 | 5/1989 |

(Continued)

OTHER PUBLICATIONS

Translation of Japanese Examination Report.

*Primary Examiner* — David S Blum
(74) *Attorney, Agent, or Firm* — Cozen O'Connor

(57) ABSTRACT

A module comprising a regular arrangement of individual radiation-emitting semiconductor bodies (1) which are applied on a mounting area (6) of a carrier (2), wherein a wire connection is fitted between two adjacent radiation-emitting semiconductor bodies (1) on a top side, opposite to the mounting area (6), of the two radiation-emitting semiconductor bodies (1).

25 Claims, 5 Drawing Sheets

FOREIGN PATENT DOCUMENTS

| | | | |
|---|---|---|---|
| EP | 1465256 | * | 4/2003 |
| EP | 1 465 256 | | 10/2004 |
| JP | 49052477 | | 5/1974 |
| JP | 53008586 | | 1/1978 |
| JP | 55172981 | | 12/1980 |
| JP | 60-147178 | | 8/1985 |
| JP | 2002-329896 | | 11/2002 |
| TW | 444932 | | 7/2001 |
| WO | WO 03036731 | * | 5/2003 |
| WO | WO 2004023568 | * | 3/2004 |

* cited by examiner

MODULE COMPRISING RADIATION-EMITTING SEMICONDUCTOR BODIES

RELATED APPLICATIONS

This is a U.S. national stage of application No. PCT/DE2006/000232, filed on Feb. 10, 2006.

This patent application claims the priority of German patent application no. 10 2005 009 060.5 filed Feb. 28, 2005, the disclosure content of which is hereby incorporated by reference.

FIELD OF THE INVENTION

The invention relates to a module comprising a regular arrangement of individual radiation-emitting semiconductor bodies.

BACKGROUND OF THE INVENTION

The published patent application EP 0 303 741 describes a display comprising light-emitting diodes. The light-emitting diodes are in this case situated on a circuit board, to which they are electrically conductively connected in each case.

The published patent application WO 02/33756 A1 discloses an LED module having a carrier with a planar main area, on which a plurality of LED semiconductor bodies are applied. The LED semiconductor bodies can be electrically connected by means of a chip connection region situated between the carrier and the LED semiconductor body, and a contact area applied on that side of the LED semiconductor body which is remote from the carrier. For connecting the LED semiconductor bodies to one another, wire connections run from the contact area of the LED semiconductor bodies to the chip connection region of the adjacent LED semiconductor bodies.

Modules comprising radiation-emitting semiconductor bodies having small dimensions and a high luminance are required for many applications. Modules of this type are suitable in particular as semiconductor light source in conjunction with imaging optical arrangements such as projectors, for example.

An increase in the luminance of a module comprising radiation-emitting semiconductor bodies can be achieved, in principle, by increasing the radiation density of the individual semiconductor bodies, at the same time the optical output power being maintained or increased.

Furthermore, in order to increase the luminance it is possible to reduce the area on which the radiation-emitting semiconductor bodies are arranged. However, in the context of advancing miniaturization of the module, one problem consists in accommodating bond pads for making contact with the semiconductor bodies on an ever decreasing area of the module.

SUMMARY OF THE INVENTION

It is an object of the present invention to provide a module comprising radiation-emitting semiconductor bodies having a high luminance, which module has a highest possible packing density of the individual semiconductor bodies.

This and other objects are attained in accordance with one aspect of the present invention directed to a module according to the invention has a regular arrangement of individual radiation-emitting semiconductor bodies which are applied on a mounting area of a carrier, wherein a wire connection is fitted between two adjacent radiation-emitting semiconductor bodies on a top side, opposite to the mounting area, of the two radiation-emitting semiconductor bodies.

Such a module enables a high packing density on account of an advantageous arrangement or configuration of the radiation-emitting semiconductor bodies.

In this case, radiation-emitting semiconductor bodies should be understood to mean primarily light-emitting diode semiconductor bodies with contact areas. More widely, other radiation emitters can also be used in the case of the invention. This includes inter alia, besides light-emitting diodes, luminescence diodes in general, for example laser diodes, superemitters and OLEDs. Furthermore, the radiation emitter is preferably an electromagnetic radiation-emitting diode having an at least approximately Lambertian emission characteristic, particularly preferably a thin-film light-emitting diode chip.

A thin-film light-emitting diode chip is distinguished, in particular, by the following characteristic features:
- a reflective layer is applied or formed at a first main area—facing a carrier element—of a radiation-generating epitaxial layer sequence, said reflective layer reflecting at least part of the electromagnetic radiation generated in the epitaxial layer sequence back into the latter,
- the carrier element is an element which differs from the growth substrate on which the epitaxial layer sequence was grown, and is applied to the epitaxial layer sequence prior to the stripping away of the growth substrate,
- the epitaxial layer sequence has a thickness in the range of 20 µm or less, in particular in the region of 10 µm, and
- the epitaxial layer sequence contains at least one semiconductor layer having at least one area which has an intermixing structure that ideally leads to an approximately ergodic distribution of the light in the epitaxial layer sequence, that is to say that it has an as far as possible ergodically stochastic scattering behavior.

Preferably, the semiconductor layer is fabricated from a material containing a compound comprising elements of main groups III and V of the periodic table. Particularly preferably, said layer contains GaAs or AlGaAs ($Al_xGa_{1-x}As$ where $0 \leq x \leq 1$), wherein it goes without saying that it is also possible to provide III-V compound semiconductors such as GaP or GaN and also compounds based thereon or derived therefrom, such as $InGaAlP$ ($In_xAl_yGa_{1-x-y}P$ where $0 \leq x \leq 1$; $0 \leq y \leq 1$),
$InGaAlN$ ($In_xAl_yGa_{1-x-y}N$ where $0 \leq x \leq 1$; $0 \leq y \leq 1$), or
$InGaAlPN$ ($In_xAl_yGa_{1-x-y}P_nN_{1-n}$ where $0 \leq x \leq 1$; $0 \leq y \leq 1$; $0 \leq n \leq 1$) within the scope of the invention.

In one advantageous embodiment, the radiation-emitting semiconductor bodies are arranged in accordance with a matrix composed of columns and rows on the carrier. In this case, the number of columns can correspond to the number of rows. Preferably, the number of columns differs from the number of rows. By way of example, a matrix size of 3×4, 4×3 or 16×9 can be chosen. These sizes correspond to standardized TV formats, whereby such a module is suitable for commercial projection applications. Matrix sizes having a higher number of radiation-emitting semiconductor bodies are also conceivable. The luminance can thereby advantageously be increased.

Preferably, a constant distance is chosen between the rows and columns of radiation-emitting semiconductor bodies. Said distance can be 200 µm, a deviation of 5% lying within the tolerance range. The distance is advantageously 100 µm. Distances that fall below 100 µm may prove to be particularly advantageous. By means of a smallest possible distance between the individual radiation-emitting semiconductor bodies, it is possible in this case to obtain a high packing density and consequently a high luminance.

In previously known modules of radiation-emitting semiconductor bodies, by contrast, the distance between the semiconductor bodies is limited by the fact that when more than three semiconductor bodies are arranged alongside one another, it is necessary to provide a gap for a bond pad. This restricts the packing density. In the case of the present invention, by contrast, a bond pad between the adjacent semiconductor bodies is not required since the wire connection is led from semiconductor body to semiconductor body.

In one embodiment of the invention, a plurality of bond pads can be disposed laterally downstream of the radiation-emitting semiconductor bodies. The bond pads can therefore advantageously be situated outside the matrix of radiation-emitting semiconductor bodies. A suitable electrical connection of the radiation-emitting semiconductor bodies also enables the electrical supply of the radiation-emitting semiconductor bodies which are not directly adjacent to the bond pads.

The packing density of the module disclosed herein can be increased by approximately 30% relative to a conventional module.

Preferably, the radiation-emitting semiconductor bodies are connected up in series in a respective column of the matrix.

In one possible embodiment, for this purpose, two adjacent radiation-emitting semiconductor bodies of a column are arranged inversely with respect to one another, that is say that the top side of one radiation-emitting semiconductor body has a layer of a first conduction type and the top side of the radiation-emitting semiconductor body that is adjacent in the column has a layer of a second conduction type. By way of example, a p-type layer is situated at the top side of one radiation-emitting semiconductor body and an n-type layer is situated at the top side of the adjacent radiation-emitting semiconductor body. In an advantageous manner, as many semiconductor bodies as desired can be arranged and connected up in series in a column.

Preferably, the inversely arranged radiation-emitting semiconductor bodies of the matrix are situated on a common metallization applied to the mounting area of the carrier. Particularly preferably, the metallization has interruptions between the columns and rows. Furthermore particularly preferably, the distance between the interruptions of rows corresponds to double a distance between rows.

The electrical connection of the radiation-emitting semiconductor bodies can be effected by means of the metallization and by means of wire connections. The wire connections particularly preferably run above the plane in which the top side of the radiation-emitting semiconductor bodies is situated. This enables a simple fitting of the wire connections since it is possible to operate exclusively in one plane.

Preferably, the radiation-emitting semiconductor bodies of a column are connected up in series. In addition, the columns of radiation-emitting semiconductor bodies connected up in series can be connected up in parallel.

Furthermore, it is conceivable for only two radiation-emitting semiconductor bodies of a column to be connected up in series. Further advantageous possibilities of interconnection can be realized on the basis of the geometrical arrangement of the radiation-emitting semiconductor bodies in a matrix and the bond pads surrounding them.

In a further possible embodiment, the radiation-emitting semiconductor bodies are contact-connected twice on the top side, that is to say that they have both a means for n-type contact-connection and a means for p-type contact-connection on the top side. The top side of the radiation-emitting semiconductor bodies is correspondingly structured for this.

The thin-film semiconductor bodies preferably have a radiation-generating layer sequence as topmost layer sequence, a p-type contact-connection being applied on said radiation-generating layer sequence. The radiation-generating layer sequence has an active layer containing GaN, for example. On that side which faces the mounting area of the carrier, there may be disposed downstream of the active layer further layers, for example a barrier layer containing TiWN, a protective layer containing Ti/Pt/Au, and an anticorrosion layer containing Au. Furthermore, the layers mentioned can be bonded onto a carrier element containing Ge, for example, by means of a hard solder containing AuSn, for example. On that side of the carrier element which is remote from the mounting area, there may furthermore be provided a protective layer containing Ti/Pt/Au, for example, a barrier layer containing TiWN, for example, and a basic metallization containing AuSb, for example. On that side which faces the mounting area, the carrier element may have a layer containing Au.

On the carrier element, the radiation-generating layer sequence advantageously rises as a mesa structure, such that there is space for an n-type contact-connection alongside the mesa structure on the carrier element.

The radiation-emitting semiconductor bodies can be connected up in series in a column by means of a wire connection being led from the p-type contact-connection of a radiation-emitting semiconductor body to the n-type contact-connection of an adjacent radiation-emitting semiconductor body. In the first and last rows of each column, the radiation-emitting semiconductor bodies are preferably connected to bond pads. Further advantageous interconnections are conceivable on account of the geometrical arrangement and structure of the radiation-emitting semiconductor bodies.

A module according to an embodiment of the invention advantageously has a carrier containing an electrically insulating material. A carrier containing a ceramic material, for example $Al_2O_3$ or AlN, is distinguished by being wear-resistant, corrosion-resistant, UV-stable and primarily by having very good thermal conductivity. The UV-stability of the ceramic material means that the degradation of the carrier can be reduced and the service life of the module can therefore be increased. This can prove to be advantageous particularly when the module is used for projection applications. Continuous operation under varying loading, for example during switch-on or switch-off, is of importance in this case. Whereas conventional incandescent lamps have an average service life of approximately $10^3$ hours, LEDs can advantageously attain a service life (corresponding to half of the original value of the intensity) of $10^5$ to $10^6$ hours.

Furthermore, the heat dissipation, which can additionally be effected by a heat sink which contains a thermally conductive material, for example Al, and is disposed downstream of the carrier, can have a positive effect on the service life of the module. Moreover, an undesirable change in the emission characteristic of the radiation-emitting semiconductor bodies can be prevented by the cooling of the module.

The radiation-emitting semiconductor bodies can be mounted on the carrier preferably by means of a solder or an adhesive, particularly preferably by means of a metallization applied between the semiconductor body and the carrier. The metallization can at least partly cover the carrier. In this case, in contrast to the embodiment described further above, the metallization is not required for the electrical supply of the semiconductor bodies.

In order to protect the module against damaging external influences, the individual radiation-emitting semiconductor bodies or the entire module can preferably be encapsulated with a molding compound. Suitable materials include reaction resins such as, for example, epoxy resins, acrylic resins, silicone resins and polyurethane resins. Furthermore, hybrid materials such as, for example mixtures of epoxy resins and silicone may prove to be particularly suitable, the hybrid materials having the advantage of increased UV-stability by comparison with epoxy resins, by way of example.

DETAILED DESCRIPTION OF THE DRAWINGS

Figure 1:
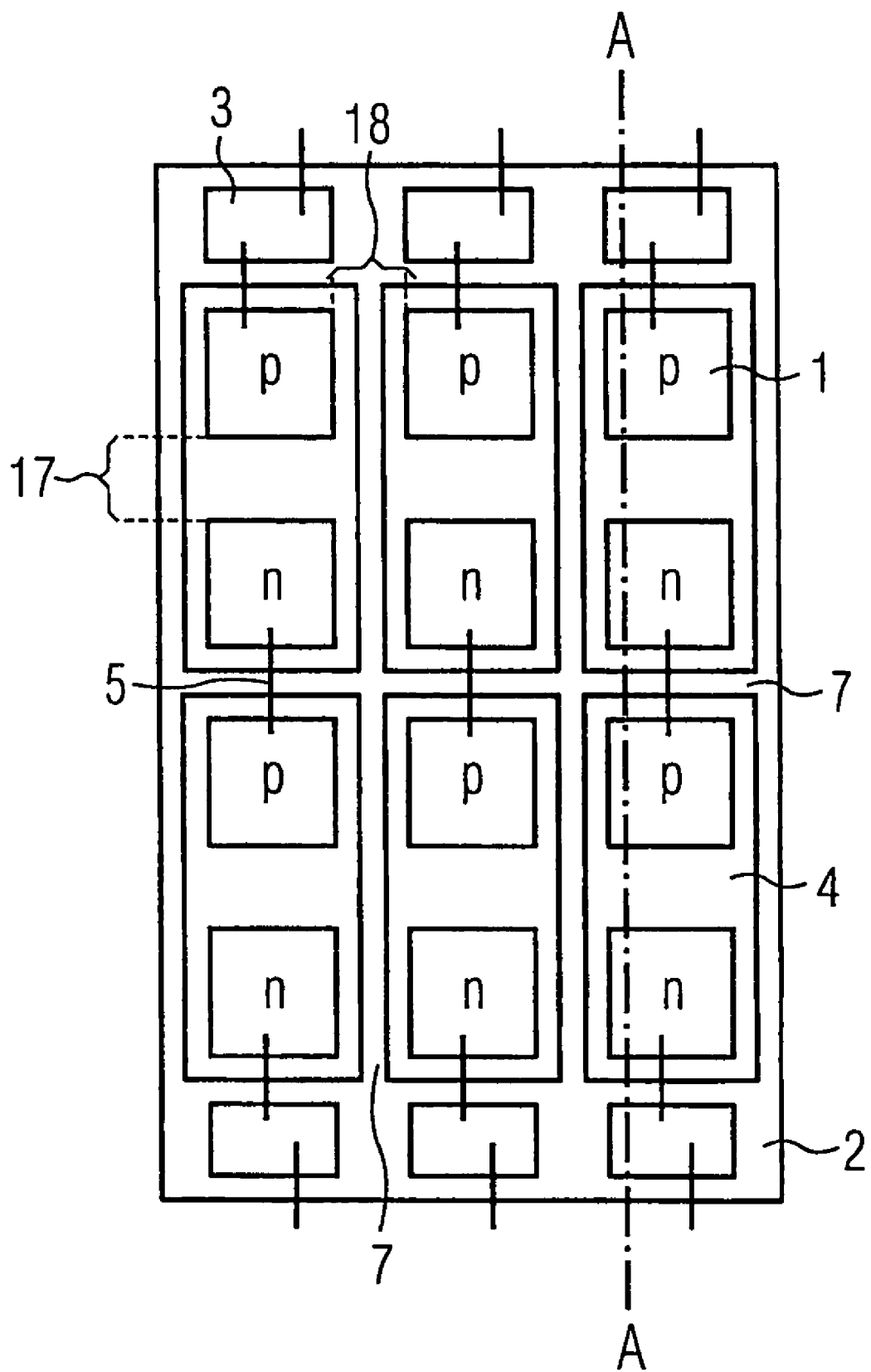
FIG. 1 shows a schematic plan view of a first exemplary embodiment of a module according to the invention.

FIG. 1 illustrates a first exemplary embodiment of a module according to the invention. The radiation-emitting semiconductor bodies 1 are arranged regularly on a carrier 2. The regular arrangement corresponds to a matrix composed of three columns and four rows. The distance 18 between columns and the distance 17 between rows are preferably 100 μm.

The radiation-emitting semiconductor bodies 1 can be contact-connected (n-type contact-connection, p-type contact-connection) at two mutually opposite sides of the semiconductor body. The radiation-emitting semiconductor bodies 1 are preferably arranged inversely, such that, of two adjacent radiation-emitting semiconductor bodies 1 in a column, one has a p-type contact-connection on that side of the carrier 2 which is remote from the mounting area 6 (see FIG. 3), and the other has an n-type contact-connection.

Particularly preferably, in each case two radiation-emitting semiconductor bodies 1 in a column which are not directly connected by a wire connection are electrically connected by a common metallization 4 applied on the carrier 2. Said metallization 4 can be embodied in strip form. Six strip-type metallizations 4 then arise for the module illustrated, in each case two inversely arranged radiation-emitting semiconductor bodies 1 being situated on said metallizations. Said semiconductor bodies 1 can be applied to the metallization 4 by means of a solder or an electrically conductive adhesive. By way of example, an Ag- or Au-containing conductive adhesive can be used for this purpose.

The radiation-emitting semiconductor bodies 1 situated on a common strip-type metallization 4 are thereby connected in series. Furthermore, two mutually adjacent radiation-emitting semiconductor bodies 1 in a column which are situated on different strip-type metallizations 4 are connected to one another by means of a wire connection 5. Finally, the outer radiation-emitting semiconductor bodies in each column are connected by means of a wire connection 5 to bond pads disposed laterally downstream of them. The radiation-emitting semiconductor bodies 1 of each column are connected up in series both by virtue of the specific form of the arrangement and by virtue of the electrical connection.

Figure 2:
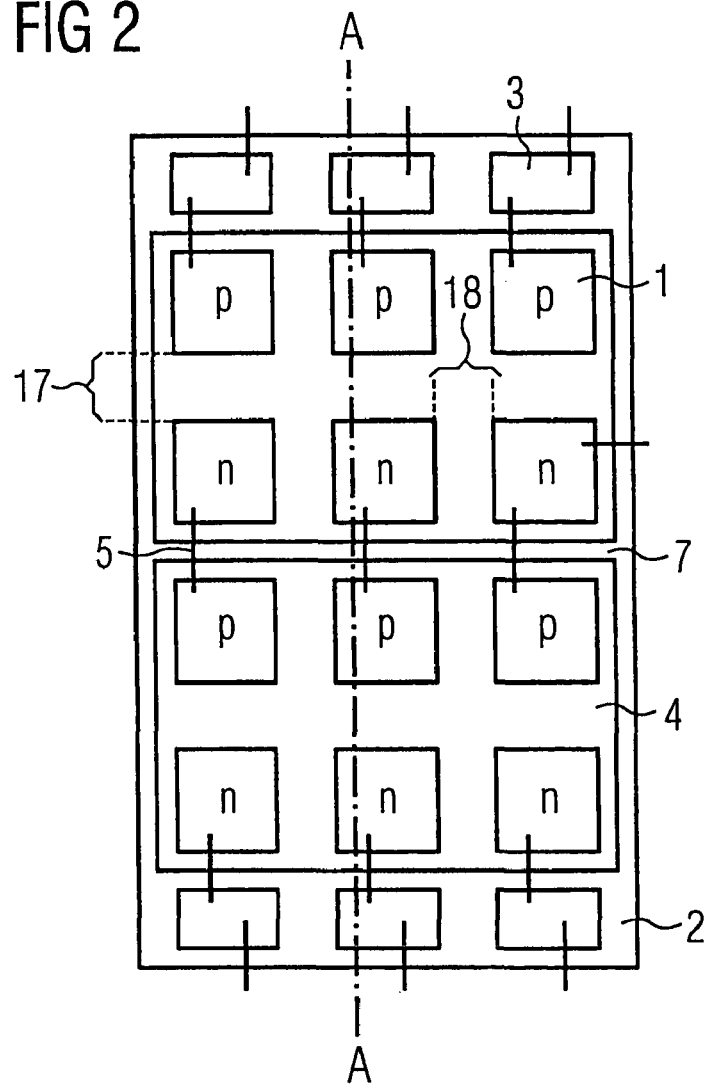
FIG. 2 shows a schematic plan view of a second exemplary embodiment of a module according to the invention.

A second exemplary embodiment of a module according to the invention is illustrated in FIG. 2. The radiation-emitting semiconductor bodies 1 are preferably situated on a carrier 2 containing an electrically insulating, preferably thermally conductive material, for example a ceramic material.

The radiation-emitting semiconductor bodies 1 are arranged regularly on the carrier 2, wherein they form a 3×4 matrix composed of three columns and four rows.

As in the first exemplary embodiment, the semiconductor bodies are arranged inversely with respect to one another, such that, of two adjacent radiation-emitting semiconductor bodies 1 in a column, one has a layer of a first conduction type on the side remote from the mounting area, and the other has a layer of a second conduction type.

Furthermore, a metallization 4 is applied on the carrier 2, said metallization preferably having an interruption between the 2nd row and the 3rd row. The wire connections between the radiation-emitting semiconductor bodies of a column run as in the first exemplary embodiment. The semiconductor bodies of a column are therefore connected up in series. In addition, the columns of radiation-emitting semiconductor bodies connected up in series are connected up in parallel. This is achieved by means of the metallization 4, which has only one interruption running parallel to the rows.

This arrangement can advantageously avoid the situation in which the semiconductor bodies of an entire column fail as soon as one radiation-emitting semiconductor body in the series is defective.

Figure 3:
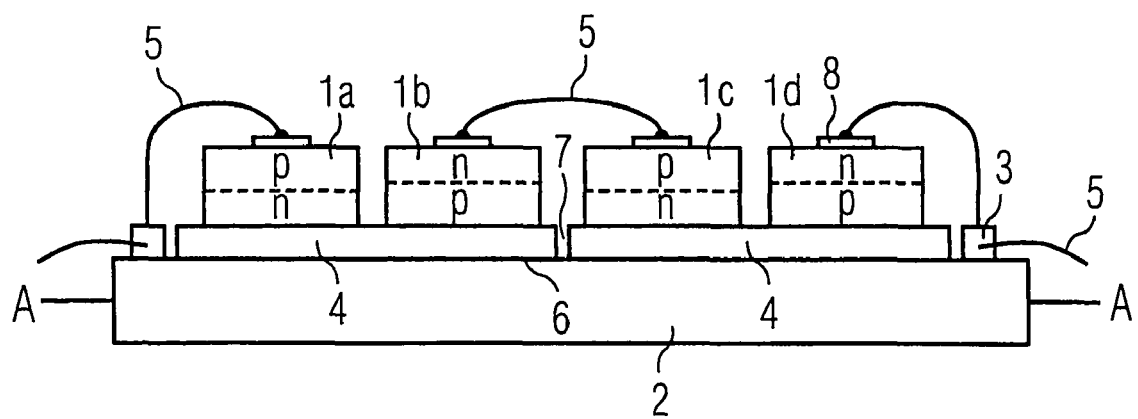
FIG. 3 shows a schematic section view of the first and second exemplary embodiments.

FIG. 3 illustrates a schematic section view of the first and second exemplary embodiments. The section A-A runs along a column.

A metallization 4 is applied on the carrier 2, said metallization having an interruption in the center of the carrier 2. Furthermore, bond pads 3 are applied on the carrier 2 on the edge side. Said bond pads 3 serve for the electrical connection of the radiation-emitting semiconductor bodies 1. The semiconductor bodies 1 are mounted in groups of two onto a common metallization 4. As illustrated in FIG. 3, said groups of two comprise two radiation-emitting semiconductor bodies 1 arranged in inverse with respect to one another.

The radiation-emitting semiconductor body 1a has a p-type contact-connection at the side remote from the mounting area and is connected to a bond pad 3 by means of a wire connection 5. The n-type contact-connection is effected by means of the metallization 4, onto which the radiation-emitting semiconductor body is mounted by means of a solder or conductive adhesive.

By contrast, the semiconductor body 1b has an n-type contact-connection on the side remote from the mounting area 6 and a p-type contact-connection on the side facing the mounting area 6.

The radiation-emitting semiconductor bodies 1a and 1b are connected up in series with one another by means of the common metallization 4, on which the two semiconductor bodies are situated.

The electrical connection of the semiconductor body 1b to the semiconductor body 1c, the metallization 4 between the two semiconductor bodies being interrupted, is effected by means of a wire connection 5 on the side remote from the mounting area 6. In this case, the radiation-emitting body 1c is arranged inversely in relation to the radiation-emitting semiconductor body 1b.

The semiconductor body 1*d* is in turn arranged inversely with respect to the radiation-emitting semiconductor body 1*c* and is situated with the latter on a common metallization 4. The electrical connection is produced by means of a wire connection 5 to a bond pad 3.

The radiation-emitting semiconductor bodies 1*a* to 1*d* illustrated are therefore connected up in series.

The wire connections 5 preferably run on that side of the radiation-emitting semiconductor bodies 1*a* to 1*d* which is remote from the mounting area 6 and are applied on a contact area 8 of the radiation-emitting semiconductor bodies 1.

Figure 4:
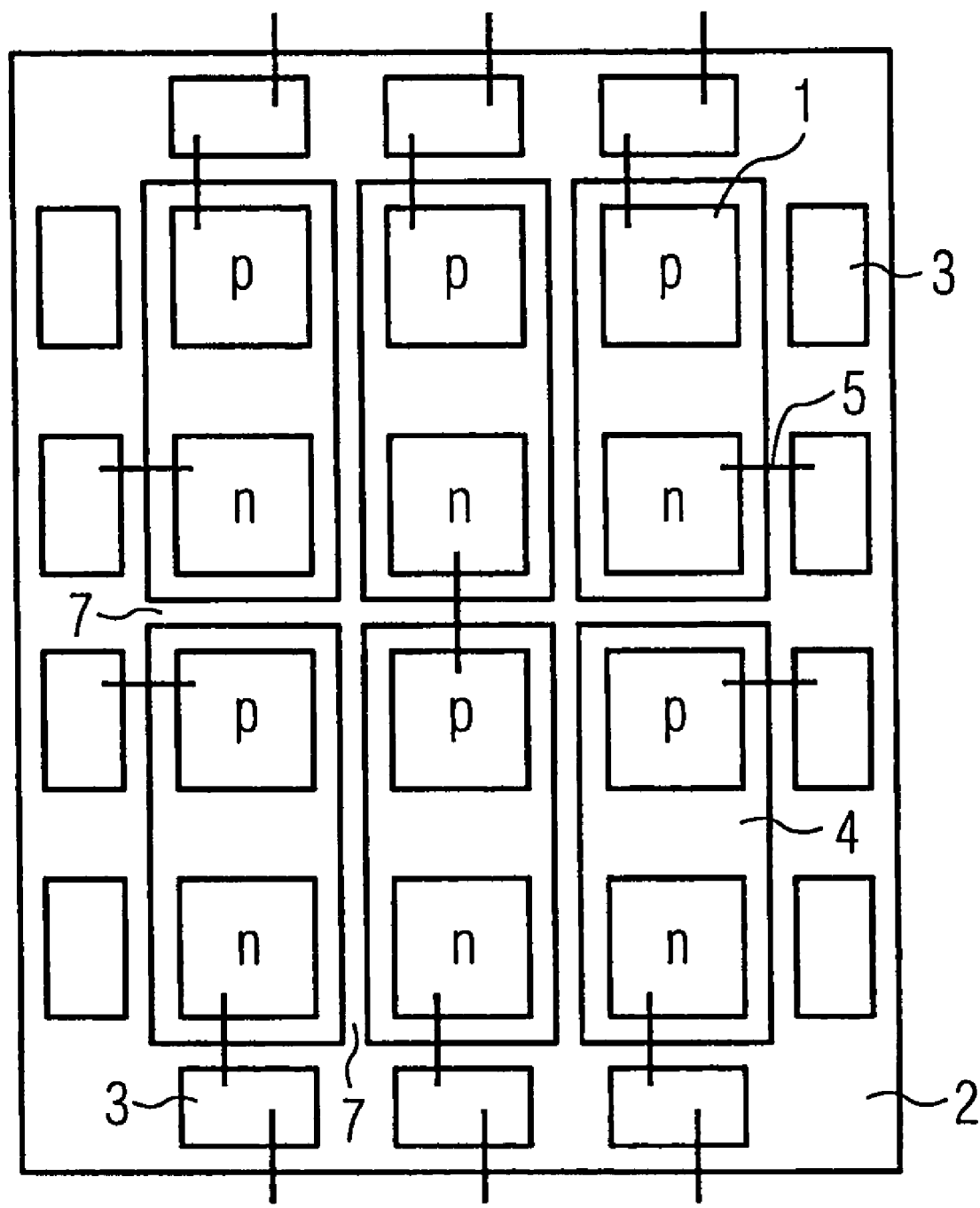
FIG. 4 shows a schematic plan view of a third exemplary embodiment of a module according to the invention.

FIG. 4 illustrates a third exemplary embodiment of a module according to the invention. In a manner corresponding to the first two exemplary embodiments, the adjacent radiation-emitting semiconductor bodies 1 of a column are arranged inversely with respect to one another.

As in the first exemplary embodiment, in each case two adjacent radiation-emitting semiconductor bodies 1 of a column are applied on a common metallization 4. In contrast to the first exemplary embodiment, however, not all the radiation-emitting semiconductor bodies 1 of each column are connected up in series with one another. Thus in the first and last columns of the matrix, only the groups of two consisting of radiation-emitting semiconductor bodies 1 which are arranged inversely with respect to one another and which are situated on a common metallization 4 are connected up in series with one another. Additional bond pads 3 disposed laterally downstream of the rows of radiation-emitting semiconductor bodies 1 make this electrical connection possible.

The advantage of this exemplary embodiment is that a total failure of the radiation-emitting semiconductor bodies 1 disposed downstream of a defective radiation-emitting semiconductor body can partly be prevented.

Figure 5:
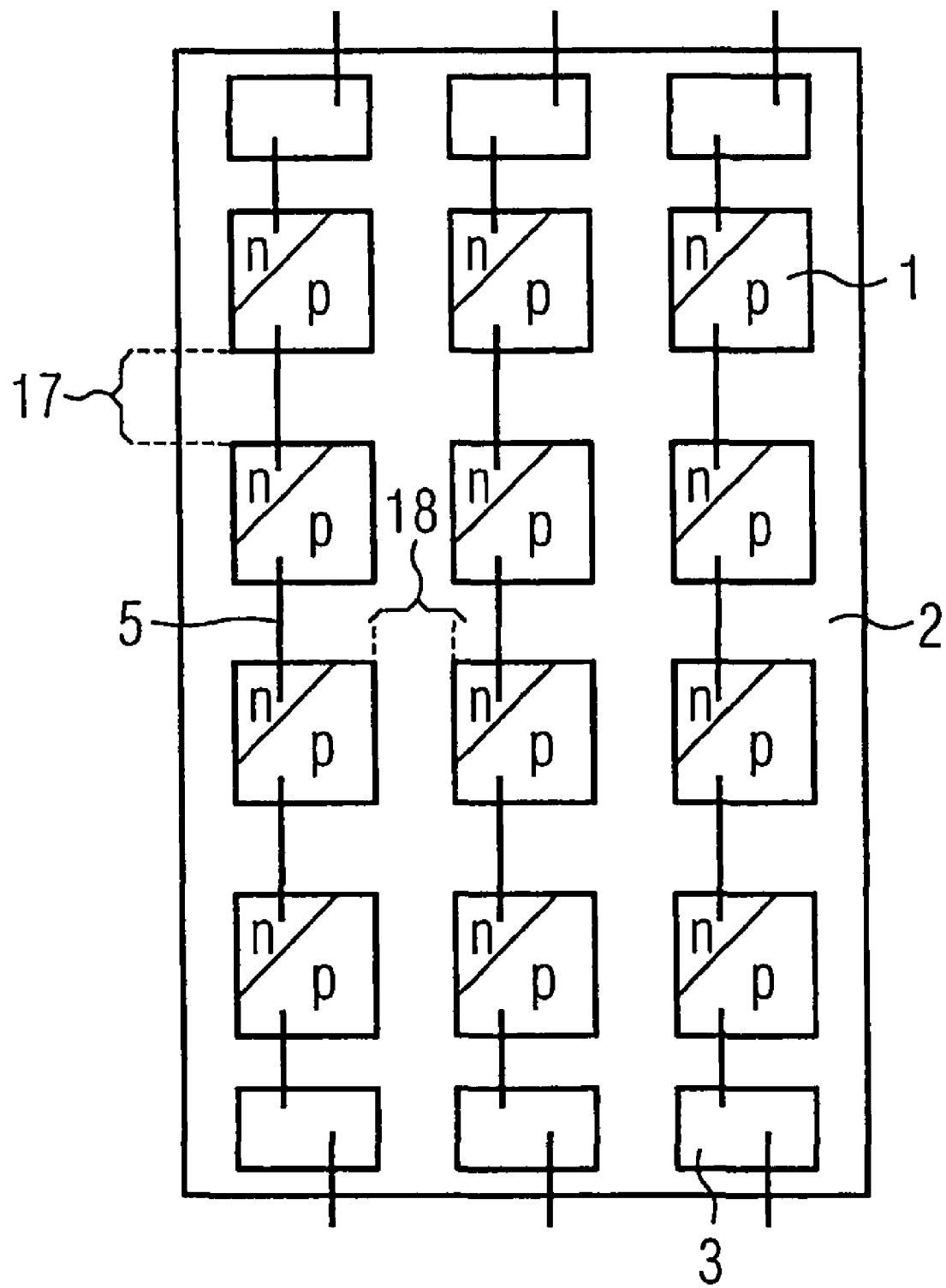
FIG. 5 shows a schematic plan view of a fourth exemplary embodiment of a module according to the invention.

FIG. 5 illustrates a fourth exemplary embodiment of a module according to the invention in a schematic plan view. The radiation-emitting semiconductor bodies 1 are arranged on a common carrier 2, which preferably contains an electrically insulating material, for example a ceramic material, and in their arrangement particularly preferably follow a matrix composed of three columns and four rows. The distance 17 between rows is preferably chosen to be equal to the distance 18 between columns and can be 200 µm, advantageously 100 µm, particularly advantageously less than 100 µm. Bond pads 3 are disposed laterally downstream of the columns of radiation-emitting semiconductor bodies 1, said bond pads being applied on the carrier 2.

Each radiation-emitting semiconductor body 1 has two contact-connections, an n-type contact-connection and a p-type contact-connection, on the side remote from the mounting area 6, such that two wire connections 5 are arranged on the top side on a radiation-emitting semiconductor body 1.

As illustrated in FIG. 5, the adjacent radiation-emitting semiconductor bodies 1 of a column are in each case electrically connected to one another by means of a wire connection 5, the latter in each case running from the p-type contact-connection of one radiation-emitting semiconductor body to the n-type contact-connection of the adjacent radiation-emitting semiconductor body, which is formed as an n-type corner contact. Consequently, the radiation-emitting semiconductor bodies 1 of a column are connected up in series. The semiconductor bodies are preferably embodied as thin-film semiconductor bodies, as will be explained in more detail below.

This embodiment of a module according to the invention advantageously enables straightforward fitting of the wire connections 5 running on the top side.

Figure 6A:
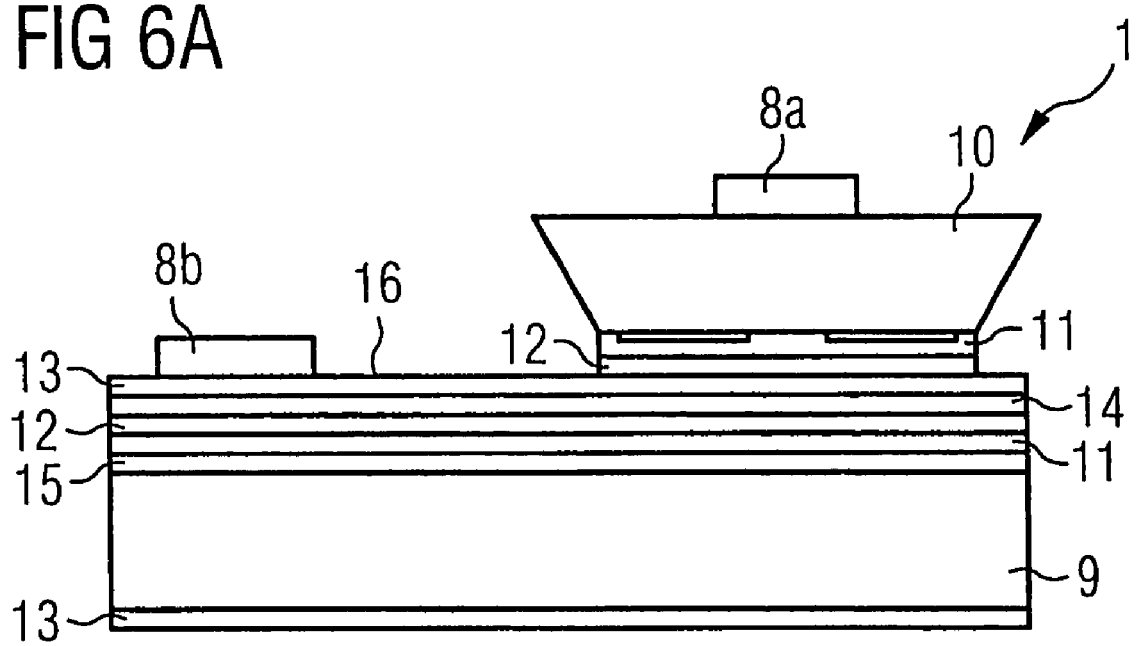
FIG. 6a shows a schematic sectional view of a thin-film semiconductor body in accordance with the fourth exemplary embodiment.

FIG. 6*a* illustrates a thin-film semiconductor body such as can be used in the fourth exemplary embodiment, for example, in a schematic section view.

The thin-film semiconductor body has a carrier element 9, which preferably contains a semiconductor material, for example Ge. A basic metallization 15, containing e.g. AuSb, is applied on the carrier element 9, the following layers being disposed downstream of said basic metallization: a barrier layer 11, containing e.g. TiWN, in order to prevent a degradation of the carrier material, and a protective layer 12, containing e.g. Ti/Pt/Au.

The radiation-generating layer sequence has an active layer 10, which preferably contains a semiconductor material composed of a III-V compound, for example GaN or InGaN, in addition a barrier layer 11 containing TiWN, for example, a protective layer 12 containing Ti/Pt/Au, for example, and an anticorrosion layer 13 containing e.g. Au. The radiation-generating layer sequence, excluding the anticorrosion layer 13, has a mesa structure formed during the production process. After the radiation-generating layer sequence has being grown onto a growth substrate, it is stripped away from the growth substrate, such that the layer 13 is then partially uncovered.

Furthermore, the radiation-generating layer sequence is applied on the carrier element 9 by means of the hard solder 14 containing AuSn, for example. The carrier element 9 can have a layer containing Au, for example, at its underside. By means of said layer at the underside, which is preferably thermally conductive, the semiconductor body can be thermally conductively connected to a heat sink for cooling purposes, which can have a positive effect on the service life of the module.

The mesa structure enables an n-type contact-connection 8*b* to be applied on the top side 16. The p-type contact-connection 8*a* is applied on the radiation-generating layer sequence comprising the active layer 10.

The p-type and n-type contact-connections are applied in the outer regions of the thin-film semiconductor body, such that the luminance is minimally reduced by the shading of the wire connections 5.

Figure 6B:
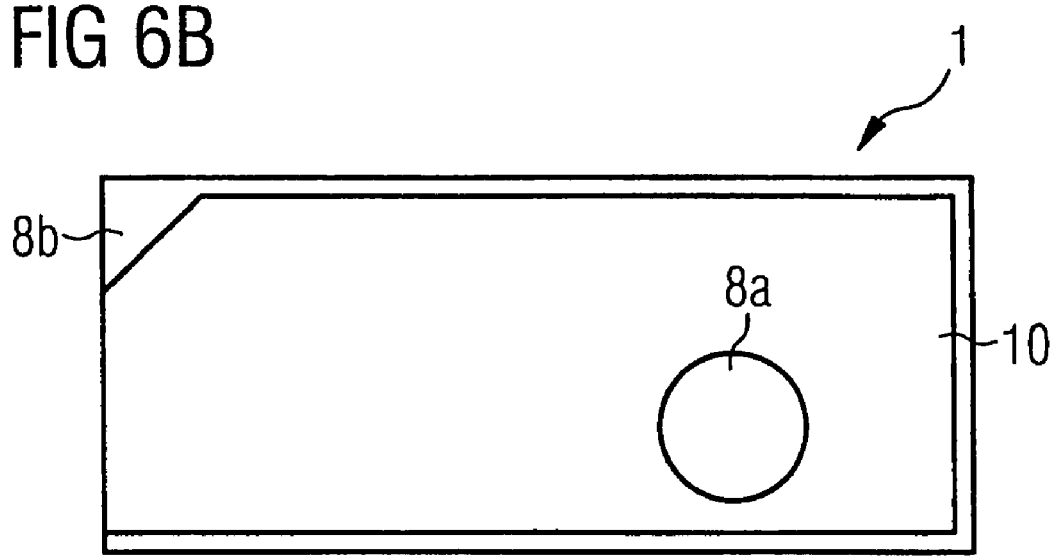
FIG. 6b shows a schematic plan view of a thin-film semiconductor body in accordance with the fourth exemplary embodiment.

FIG. 6*b* illustrates a schematic plan view of a thin-film semiconductor body. The triangular n-type contact-connection 8*b*, the upper layer of the layer sequence, which comprises the active layer 10, and the circular p-type contact-connection 8*b* can be seen in the sectional view.

The scope of protection of the invention is not limited to the examples given hereinabove. The invention is embodied in each novel characteristic and each combination of characteristics, which includes every combination of any features which are stated in the claims, even if this feature or combination of features is not explicitly stated in the examples.

The invention claimed is:

1. A module comprising:
   a matrix of individual radiation-emitting semiconductor bodies which are applied on a mounting area of a carrier; and
   a wire connection fitted between at least two adjacent ones of said radiation-emitting semiconductor bodies on a top side, opposite to the mounting area, of said two radiation-emitting semiconductor bodies, wherein
   the matrix comprises columns and rows,
   a plurality of separate bond pads are situated outside the matrix,
   separate pairs of said bond pads are arranged before and after each of said columns and before and after each of said rows of the radiation-emitting semiconductor bodies, the radiation-emitting semiconductor bodies are connected up in a plurality of series connections, and at least one of said series connections is connected by wire connections to one bond pad of said separate pairs of the bond pads before and after each of said columns and to one bond pad of said separate pairs of the bond pads before and after each of said rows.

2. The module as claimed in claim 1, wherein the matrix is a 3×4, 4×3 or 16×9 matrix.

3. The module as claimed in claim 1, wherein the distance between two rows is less than or equal to 100 µm.

4. The module as claimed in claim 1, wherein the distance between two columns is less than or equal to 100 µm.

5. The module as claimed in claim 1, wherein the radiation-emitting semiconductor bodies are connected up in series within a column.

6. The module as claimed in claim 1, wherein the radiation-emitting semiconductor bodies of two adjacent columns are connected up in parallel in a row.

7. The module as claimed in claim 1, wherein the top side of a radiation-emitting semiconductor body has a layer of a first conduction type and the top side of a radiation-emitting semiconductor body that is adjacent in the column has a layer of a second conduction type.

8. The module as claimed in claim 7, wherein the carrier has a metallization on the mounting area.

9. The module as claimed in claim 8, wherein the metallization has one or a plurality of interruptions.

10. The module as claimed in claim 9, wherein the distance between two interruptions corresponds to double a distance between rows.

11. The module as claimed in claim 1, wherein each radiation-emitting semiconductor body has both a p-type contact-connection and an n-type contact-connection at the top side.

12. The module as claimed in claim 11, wherein the n-type contact-connection is applied on the top side of a layer sequence of the radiation-emitting semiconductor body, said layer sequence being arranged on a carrier element.

13. The module as claimed in claim 11, wherein the p-type contact-connection is applied on a mesa structure of the radiation-emitting semiconductor body.

14. The module as claimed in claim 11, wherein the carrier has a metallization on the mounting area.

15. The module as claimed in claim 1, wherein a portion of the radiation-emitting semiconductor bodies are connected to the bond pads by means of a wire connection.

16. The module as claimed in claim 1, wherein the radiation-emitting semiconductor bodies are thin-film semiconductor bodies.

17. The module as claimed in claim 16, wherein the radiation-emitting semiconductor body contains a semiconductor material such as InGaN or InGaAlP.

18. The module as claimed in claim 1, wherein the carrier, on which the radiation-emitting semiconductor bodies are mounted, contains an electrically insulating material.

19. The module as claimed in claim 18, wherein the carrier contains a ceramic material.

20. The module as claimed in claim 19, wherein the carrier contains AlN.

21. The module as claimed in claim 1, wherein the radiation-emitting semiconductor bodies are encapsulated by a molding compound.

22. The module as claimed in claim 1, wherein the radiation-emitting semiconductor bodies are arranged pairwisely on metallizations along said columns, a top layer of one radiation-emitting semiconductor body of at least one pairwise arrangement of the pairwisely arranged radiation-emitting semiconductor bodies is formed by an n-type layer and a top layer of the other radiation-emitting semiconductor body is formed by a p-type layer, and the top layers of the radiation-emitting semiconductor bodies are opposite the mounting area.

23. The module as claimed in claim 1, wherein a portion of the bond pads are not connected with the semiconductor bodies.

24. A module comprising:

a regular arrangement of individual radiation-emitting semiconductor bodies which are applied on a mounting area of a common carrier, and a wire connection fitted between two adjacent ones of said radiation-emitting semiconductor bodies on a top side, opposite to the mounting area, of said two radiation-emitting semiconductor bodies, wherein each of said radiation-emitting semiconductor bodies has a carrier element and has a radiation-generating layer sequence with a mesa structure, each of said radiation-emitting semiconductor bodies has a first contact-connection and a second contact-connection on the top side, opposite to the mounting area, the first contact-connection is located on said mesa structure and said second contact-connection is located on the carrier element, the regular arrangement comprises columns of the radiation-emitting semiconductor bodies a plurality of separate bond pads are situated outside the regular arrangement, bond pads of said plurality of separate bond pads are arranged before and after each of said columns of the radiation-emitting semiconductor bodies, the radiation-emitting semiconductor bodies are connected up in a plurality of series connections, each of said series connections connects in series each of the radiation-emitting semiconductor bodies of one of said columns, and a metallic anticorrosion layer is on a side of the carrier element remote from the mounting area, said metallic anticorrosion layer extending completely between the carrier element and the radiation-generating layer sequence.

25. A module comprising:

a regular arrangement of individual radiation-emitting semiconductor bodies which are applied on a mounting area of a common carrier, and a wire connection fitted between two adjacent ones of said radiation-emitting semiconductor bodies on a top side, opposite to the mounting area, of said two radiation-emitting semiconductor bodies, wherein each of said radiation-emitting semiconductor bodies has a carrier element and a radiation-generating layer sequence with a mesa structure, each of said radiation-emitting semiconductor bodies has a first contact-connection and a second contact-connection on the top side opposite the mounting area, the first contact-connection of each of said radiation-emitting semiconductor bodies is located on said mesa structure and the second contact-connection of each of said radiation-emitting semiconductor bodies is located on the carrier element, the distance between two rows and the distance between two columns is less than or equal to 100 µm, a plurality of separate bond pads are disposed laterally downstream of the arrangement of radiation-emitting semiconductor bodies, the radiation-emitting semiconductor bodies are connected up in at least one series connection, the common carrier comprises a ceramic, each of the carrier elements comprise a semiconductor material, each of the carrier elements are fixed to the common carrier by a hard solder, and each of the radiation-generating layer sequences comprise inclined facets.

\* \* \* \* \*